(12) United States Patent
Edo

(10) Patent No.: US 6,282,150 B1
(45) Date of Patent: Aug. 28, 2001

(54) SEMICONDUCTOR MEMORY DEVICE

(75) Inventor: Sachiko Edo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/546,178

(22) Filed: Apr. 10, 2000

(30) Foreign Application Priority Data

Apr. 12, 1999 (JP) .................................................. 11-104622

(51) Int. Cl.$^7$ ...................................................... G11C 8/00
(52) U.S. Cl. ...................................... 365/233; 365/230.03
(58) Field of Search ............................... 365/230.03, 233

(56) References Cited

U.S. PATENT DOCUMENTS

| 5,883,855 | * | 3/1999 | Fujita | 365/233 |
| 5,903,514 | * | 5/1999 | Sawada | 365/233 |
| 6,064,625 | * | 5/2000 | Tomita | 365/233 |
| 6,147,926 | * | 11/2000 | Park | 365/233 |

* cited by examiner

Primary Examiner—Trong Phan
(74) Attorney, Agent, or Firm—Foley & Lardner

(57) ABSTRACT

A semiconductor memory device is used for outputting data synchronously with rise and fall phases of the reference clock, and includes: a first storage section for storing only the data for the rise-phases of the reference clock and successively outputting the data as read data; a second storage section for storing only the data for the fall-phases of the reference clock and successively outputting the data as read data; and an outputting circuit placed close to a terminal for outputting data externally, for receiving data forwarded from the first and second storage sections and outputting the received data successively according to the rise and fall edges of the reference clock. Of the first and second storage sections, the storage section that stores read data to be output first during a read operation is placed closer to the terminal than the other storage section.

18 Claims, 8 Drawing Sheets

SEMICONDUCTOR MEMORY DEVICE

BACKGROUND OF THE INVENTION

1. Field of the Invention

The present invention relates to a semiconductor memory device for outputting data at a high speed synchronized to a clock.

2. Description of the Related Art

In some semiconductor memory devices, data exchanges can take place during both rise and fall of the pulse signals of a system reference clock. This type of semiconductor memory device divides input/output data internally into two phases of the clock pulse, a rise phase and a fall phase, so that data in each phase are processed internally at twice the period of the external data period, thus enabling an apparently high internal processing speed to be consistent with highspeed serial data transfer.

FIG. 10 shows a schematic diagram of a conventional configuration of such a semiconductor memory device, in which serial data synchronized to a reference clock are processed through an input/output (i/o) pad 100, which is for connection to an external environment. The reference clock is a system reference clock in the system including this semiconductor memory device. Serial data exchanged with the external environment are processed one bit at time at the rise and fall phases of each clock pulse in the memory device. In general, data processed during the rise phase of the pulses are called even data, and data processed during the fall phases of the pulses are called odd data (these expressions will be used in the following presentation).

A demultiplexer 101 separates serial write-data input via the i/o pad 100 into even data and odd data according to the system reference clock CLK. The demultiplexer 101 supplies even data to serial-parallel conversion circuits 102-1e, 102-2e, and odd data to serial-parallel conversion circuits 102-1o, 102-2o.

Serial-parallel conversion circuits 102-1e, 102-2e and 102-1o, 102-2o supply parallel data outputs to respective write-amps 103-1, 103-2, which enter the data to respective memory cells in the memory cell arrays 104-1, 104-2. These serial-parallel conversion circuits and write-amps are controlled according to into which of the memory cell arrays the data are to be entered. When the data are to be entered into memory cell array 104-1, only the serial parallel conversion circuit 102-1e, 102-1o and write-amp 103-1 are operated while, when the data are to be entered into memory cell array 104-2, only the serial parallel conversion circuit 102-2e, 102-2o and write-amp 103-2 are operated.

Data output from the memory cell arrays 104-1, 104-2 are amplified by respective data-amps 105-1, 105-2 for amplifying data to be supplied to parallel-serial conversion circuits 106-1e, 106-2e and 106-1o, 106-2o. The output data are parallel data constituted by the even data and odd data entered by the write-amps, and even data are supplied to parallel-serial conversion circuits 106-1e, 106-2e while odd data are supplied to parallel-serial conversion circuits 106-1o, 106-2o. A multiplexer 107-e selects and outputs even data output from parallel-serial conversion circuits 106-1e or 106-2e, while a multiplexer 107-o selects and outputs odd data output from 106-1o or 106-2o.

These data-amps, parallel-serial conversion circuits and multiplexers are controlled according to which of the memory cell arrays is to be used for reading the data. That is, when the data are to be read from the memory cell array 104-1, only the data-amp 105-1 and the parallel-serial conversion circuits 106-1e and 106-1o are operated so that the multiplexers 107-e, 107-o select data output from the parallel-serial conversion circuits 106-1e, 106-1o and output those data respectively. On the other hand, when the data are to be read from the memory cell array 104-2, only the data-amp 105-2 and the parallel-serial conversion circuits 106-2c and 106-2o are operated so that the multiplexers 107-e, 107-o select data output from the parallel-serial conversion circuits 106-2e, 106-2o and output those data respectively. Operational control for such read steps and above write steps is carried out by a control circuit (not shown) by supplying appropriate control or selection signals (for example, the selection signals "U/L" indicated in FIG. 10) according to read/write addresses.

A multiplexer 108 outputs even data from the multiplexer 107-e during the rise phase of the system reference clock CLK, and outputs odd data from the multiplexer 107-o during the fall phase of the system reference clock CLK. Output data from the multiplexer 108 are output externally from the i/o pad 100.

According to such a device structure, when write-data are input into the i/o pad 100, data are divided in the demultiplexer 101 into even data and odd data, and the divided data are supplied to the respective serial-parallel conversion circuits. If the specified write address is in the memory cell array 104-1, inside the semiconductor memory device, even data are accepted by the serial-parallel conversion circuit 102-1e during the fall phases of the reference clock while odd data are accepted in the serial-parallel conversion circuit 102-1o during the rise phases of the reference clock. (It should be noted that, inside the memory device, there is no restriction regarding processing of even and odd data during the rise or fall phase of the clock pulse, so that such inversion of the timing of data exchange is allowable. Such method can be used for read-operations.) Accordingly, even data and odd data are converted to parallel-data, and are entered through the write-amp 103-1 into specific memory cells in the memory cell array 104-1.

When the data are to be read, data from appropriate memory cells corresponding to read addresses are supplied to the data-amp. If the specified read address is in the memory cell array 104-1, parallel even data and odd data from the memory cell array 104-1 are output to parallel-serial conversion circuits 106-1e, 106-1o through the data-amp 105-1 for conversion to serial data and the converted data are supplied to the multiplexers 107-e, 107-o. That is, even data are successively supplied to the multiplexer 107-e while being synchronized to the fall phases of the reference clock, and odd data are successively supplied to the multiplexer 107-o while being synchronized to the rise phases of the reference clock.

Then, multiplexers 107-e, 107-o select data from the respective parallel-serial conversion circuits 106-1e, 106-1o for outputting to the multiplexer 108, which selects data alternately during the rise or fall of the system reference clock pulses for successive data output. Accordingly, high-speed serial data are output externally one bit at a time during either the rise or fall of the reference clock pulses from the i/o pad 100. It should be noted that, in the memory cell array 104-2, processes similar to those described for the memory cell array 104-1 are carried out for the read/write data.

In recent years, increased circuit density of LSI devices has caused the operational speed of CPU to increase so that the system clock now operates at a speed exceeding 400 MHz. In contrast, although the capacity of semiconductor memory device has been increased, the resulting increase in the length of internal lines (for example, word lines, bit lines, and the like) causes an increase in the duration of charging/discharging the lines, thus slowing the response speed of the memory device so that the operational speed cannot be improved to the extent achievable in CPU circuits. In such semiconductor memory devices, it is essential that the slower internal processes be made compatible with the faster external data i/o processes to compensate for the difference in the longer operational cycle of the internal devices and shorter cycles of the external devices.

In such a situation, the conventional semiconductor memory devices described above can achieve an internal processing cycle that is double the processing cycle of the highspeed data i/o cycle by dividing the i/o data into two phases between the aft-stage of the demultiplexer and the fore-stage of the multiplexer. For this reason, it is necessary to position the input circuits (including demultiplexer 101) and output circuits (including multiplexers 107-*e*, 107-*o* and 108) close to the i/o pad 100, which serves as the boundary between the interior and exterior of the semiconductor memory device.

On the other hand, it is general that the i/o pads are placed close to the periphery of the chip, in which the semiconductor memory device is packaged in a resin, and the i/o pads are connected to the corresponding external lead terminals positioned at the periphery of the chip by wire bonding. However, in most layouts of the memory devices requiring a high capacity and high speed, i/o pads are arranged near the central band-like region (which will be referred to as the central region) of the memory package, and the memory cell arrays are placed on both lateral regions of the central region. High capacity memories nearly always follow such a dual-in-line package design.

Also, miniature packaging is demanded for the semiconductor memory device, and the device is often assembled into a chip size package (CSP) such as ball grid array (BGA). In the BGA package, i/o pads are arranged in the central region to correspond with a group of ball contacts, made of solder and the like, that are arranged in a grid pattern near the center area of the back of the packaging. When it is desired to minimize re-designing of an existing device to increase the memory capacity or to increase the data width for such BGA packaging, it is preferable to retain the existing configuration of address and data terminals so that the additional address and data terminals would be placed in the outer region of the existing terminals. Further, ball arrangement and their terminal assignments (to which i/o pads they will be connected) as well as the capacitance and inductance of each electrode are pre-determined in the specification concerning the semiconductor memory device, so a method of wiring from the ball grid is also specified. For these reasons, it is inevitable also from the structural viewpoint that the position of the i/o pads is chosen close to the central region.

Also, control circuits for peripheral circuits are also provided in the central region because of similar restrictions and their functional requirements. In such a case, if the i/o pads are located in the center line of the central region of the chip and the control circuits are placed on the lateral regions of the center line, data transfer in the control circuits must be performed by detouring the i/o pads, so that the circuit complexity increases considerably, and moreover, i/o pads must be spaced apart to allow for those interconnection lines. For this reason, circuits in semiconductor memory devices are laid out so that control circuits can be grouped to the one side or the other side of the central region so that the i/o pads can be placed on the opposing side so that the memory cell arrays are laid out on both outer regions of the central region of the memory chip.

Therefore, input/output (i/o) circuits (the above-mentioned input circuits and output circuits) that should be placed near the i/o pads are placed away from the center line of the memory chip. Accordingly, the path lengths of the lines from the i/o circuits to memory cell arrays on both outer regions are different, so that output data (read-data) from memory cell arrays that are distant from the i/o circuits are delayed in arriving at the output circuits. For example, in FIG. 10, if the i/o pad 100 is disposed closer to memory cell array 104-1 within the central region, parallel-serial conversion circuits 106-1*e*, 106-1*o* are relatively close to the output circuit (such as multiplexer 107-*e*), but the parallel-serial conversion circuits 106-2*e*, 106-2*o* are located further away, and read-data from memory cell array 104-2 take longer to arrive at the output circuit.

The difference in the arrival times of read-data to propagate from memory cell arrays to output circuit is of the order of 0.1 ns, when the system clock is operating at 400 MHz in a memory device having a width of the central region at 1500 $\mu$m and the output circuit is placed within the central region at a width ratio of 1200:300 $\mu$m. This order of time difference is not particularly serious when the data which have already been entered in the parallel-serial conversion circuits are to be output successively during the subsequent rise and fall phases.

However, for the lead-bit data (data of the bit to be sent first to the output circuit) for a read step, the lead-bit data must arrive at the output circuit synchronously with the first rise or fall phase of the system clock for the read step, including the time required to pass through the data-amp and parallel-serial conversion circuit. Therefore, when the read-data are located in the distant memory cell array, device operational speed is reduced. For this reason, in conventional semiconductor memory devices, the operational speed characteristics are determined by the slowest read speed, in other words, the read time required for the memory cell array further from the output circuit determines the operational speed of the device.

Furthermore, conventional semiconductor memory devices, because of the device configuration, include the read-data multiplexers (107-*e* and 107-*o* in FIG. 10) for selecting memory cell arrays to be selected as well as the divided-data multiplexer (108 in FIG. 10) for selecting either the even data or odd data. Therefore, read-data output from the parallel-serial conversion circuits must pass through two gates before they can reach the i/o pad. For this reason, propagation delay of read-data is increased, thus contributing another reason for reducing the operational speed of the device.

SUMMARY OF THE INVENTION

It is an object of the present invention to provide a fast semiconductor memory device by resolving the degradation in performance caused by differences in the time required for read data to reach the output circuit from various memory locations, and by eliminating causes for delaying read data transmission within the device.

The present invention provides a semiconductor memory device for outputting data externally in response to the rise and fall of the pulse signals of a reference clock, comprising:

a first storage section for storing only data for rise-phases of the reference clock and outputting the data successively for read operations;

a second storage section for storing only data for fall-phases of the reference clock and outputting the data successively for read operations; and data output means disposed in a vicinity of a terminal means for outputting data to an external environment for receiving data from the first storage section and the second storage section, and forwarding the data to the terminal means according to the rise and fall of the reference clock; wherein whichever storage section, the first storage section or the second storage section, that stores read data to be output first during a read operation is disposed closer to the data output means than the other storage section.

The present invention also provides a semiconductor memory device for outputting data externally in response to the rise and fall of the pulse signals of a reference clock, comprising:

a first storage section for storing only data for rise-phases of the reference clock and outputting the data successively for read operations;

a second storage section for storing only data for fall-phases of the reference clock and outputting the data successively for read operations; and data output means disposed in a vicinity of a terminal means for outputting data to an external environment for receiving data from the first storage section and the second storage section, and forwarding the data to the terminal means according to the rise and fall of the reference clock; wherein a path length connecting whichever storage section storing read data to be output first during a read operation to the data output means is made shorter than a path length connecting the other storage section to the data output means.

Therefore, in the present semiconductor memory device, the storage section is divided into one section for storing data to be processed only during the rise-phases and another section for storing data to be processed only during the fall-phases. Of the two storage sections, the storage section for storing data to be output first for a read operation is located closer to an output means for outputting data to the data output terminal than the other storage section. Alternatively, the path length connecting that storage section to the output means is made shorter than the path length connecting the other storage section to the output means. Such arrangements of component sections within the memory device allows the first read data to be output through the shorter transmission path so that the data are always output rapidly. Accordingly, the present memory device is able to provide highspeed access to data by resolving the problem of degrading system performance caused by differences in the time required for the data to reach the output means from memory areas located at various locations within the memory device.

Further, because one storage section is dedicated to data to be processed during the rise-phases, and other storage section is dedicated to data to be processed during the fall-phases, an additional outputting means, which would be necessary for outputting data from either one of the two storage sections in a conventional memory device to store mixed data in both storage sections, is not required in the present memory device. Accordingly, elements to cause delay in data propagation inside the conventional memory device have been eliminated to produce a faster memory device of the present invention.

The present invention further provides a semiconductor memory device for alternately outputting data stored in a first storage section and a second storage section to an external environment through terminal means, wherein the terminal means is disposed between the first storage section and the second storage section in such a way that data stored in the first storage section is output first, then data stored in the second storage section is output, and that the first storage section is disposed closer to the terminal means than the second storage section.

Therefore, in the present semiconductor memory device, because the first storage section from which data is output first is located closer to the terminal means than the second storage section from which data is output next, the first output data is always output rapidly through the shorter path length. Accordingly, applicability of the present memory device is not limited to those devices based on the rise and fall of a reference clock, but is applicable to any semiconductor memory devices that operate on divided data according to pre-determined clock timings. Also in such devices, the present memory device makes it possible to operate at highspeed by eliminating the time differences that are caused by differences in arrival times of data propagating from different memory area locations to a common output terminal.

DESCRIPTION OF THE PREFERRED EMBODIMENTS

Preferred embodiments will be presented in the following with reference to the drawings.

1. Basic Structure

Figure 1:
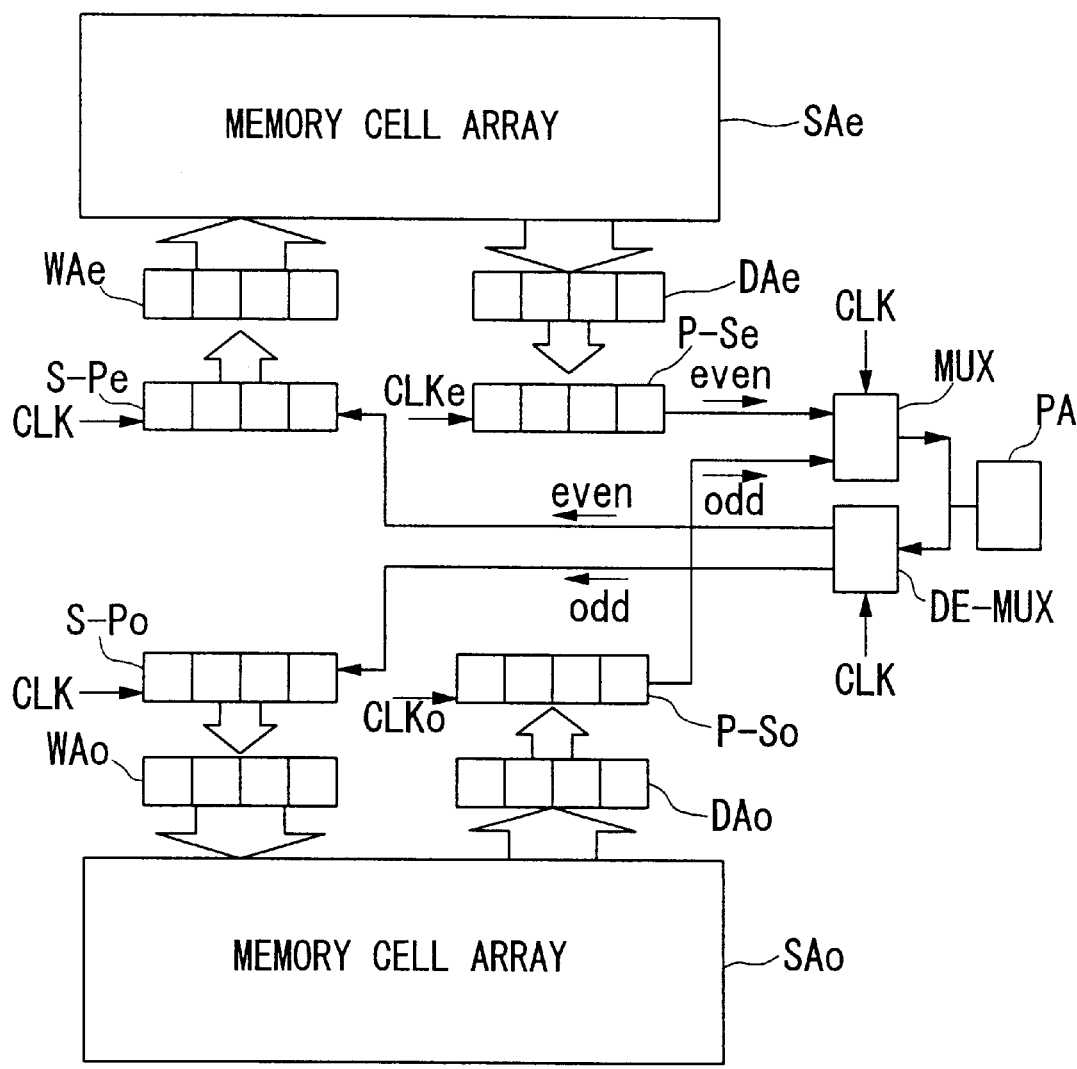
FIG. 1 is a schematic diagram of the configuration of an embodiment of a semiconductor memory device of the present invention.

FIG. 1 shows an example of the structure of the present semiconductor memory device (referred to as memory device hereinafter) including an input/output pad (i/o pad) PA for connection to an external environment, disposed in the so-called i/o pad region which is the central region close to the center line of the device chip. On both lateral regions of the central region, memory cell arrays and other circuits are fabricated, but the details will be described later. The i/o pad PA is positioned so as to be closer to one of the lateral memory cell arrays disposed on one lateral region while the other lateral region contains control circuits and the like but these are omitted.

The i/o pad PA is an example of terminal means for inputting and outputting data, and is not limited to the one shown in FIG. 1, such that a plurality of pads may be provided as terminal means for inputting and outputting data depending on the width of the data to be exchanged. Also, though not shown, the memory device has additional pads for input signals such as address signals, control signals and reference clock signal pulses so as to receive signals necessary for read/write operations through such pads.

The i/o pad PA receives and transmits serial data synchronized to the system reference clock provided in the system containing the memory device. The serial data are to include one bit at a time synchronized to the rise and fall of the pulse signals of the system reference clock. In the following presentation, data (data exchanged with the external environment at this i/o pad PA) associated with the rise phases are referred to as the even data, while those associated with the fall phases are referred to as the odd data. However, for processing within the memory device itself, there is no restriction placed on processing even or odd data at rise phases or fall phases so that the data timing may be inverted for the purpose of internal processing. For this reason, clock timing for internal processing is determined suitably on the basis of design considerations. Therefore, in the following presentation, it is assumed that for external data exchanges, even data are processed during the rise phases and odd data during the fall phases, while for internal data exchanges, even data are processed during the fall phases and odd data are processed during the rise phases.

A demultiplexer DE-MUX is disposed in the vicinity of the i/o pad PA, and constitutes a component of the input circuit together with a buffer circuit and the like, which are not shown. The demultiplexer DE-MUX divides serial data input in the i/o pad PA into even data and odd data according to the system reference clock CLK, and supplies even data to the serial-parallel conversion circuit S-Pe and odd data to the serial-parallel conversion circuit S-Po, respectively.

The demultiplexer DE-MUX begins outputting each even bit of data from the fall-edge of the system reference clock CLK but holds outputting the bit until the next fall-edge, and similarly it begins outputting each odd bit of data from the rise-edge of the system reference clock CLK but holds outputting the bit until the next rise-edge. Accordingly, even data and odd data are converted into contiguous two-phase serial data at twice the period of i/o data, and are supplied to respective parallel-serial conversion circuits S-Pe, S-Po.

The serial-parallel conversion circuits S-Pe, S-Po convert the respective even data and odd data of a predetermined number of bits supplied by the demultiplexer DE-MUX into parallel data, and output the converted data to the respective write-amps WAe, WAo. The write-amps WAe, WAo amplify the even data and odd data supplied from the serial-parallel conversion circuits S-Pe, S-Po to a predetermined signal level and output them to the respective regions in the memory cell arrays SAe, SAo.

Memory cell arrays SAe, SAo are memory regions having solid-state memory cells arranged in an array, and receive respective parallel data (write-data) output from the write-amp SAe, SAo during the write period of operation. Therefore, the memory cell array SAe stores only the even data while the memory cell array SAo stores only the odd data, and during the read period of operation, even data of the predetermined number of bits are output in parallel from the memory cell array SAc to the data-amp DAe, and odd data of the predetermined number of bits are output in parallel from the memory cell array SAo to the data-amp DAo.

Data-amps DAe, DAo are amplifiers for amplifying the even data and odd data output from the respective memory cell arrays SAe, Sao, and output the amplified data to the parallel-serial conversion circuits S-Pe, S-Po.

The parallel-serial conversion circuit P-Se outputs successive even bit-data to synchronize with the fall phases of the clock CLKe, and during the each fall phase, holds the output of even bit-data. On the other hand, the parallel-serial conversion circuits P-So outputs successive odd bit-data to synchronize with the rise phases of the clock CLKo, and during each rise phase, holds the output of odd bit-data. The clocks CLKe, CLKo are internal clocks obtained by modifying the clock signals of the system reference clock CLK, and are finely adjusted for timing control of even and odd bits. The frequencies of these clocks CLKe, CLKo are identical to the frequency of the system reference clock CLK. These clocks CLKe, CLKo are provided suitable delays respectively (that is, each clock is delayed suitably), and each of their rise-edges and fall-edges is adjusted independently. Using such a structure, the parallel-serial conversion circuits P-Se, P-So convert data output from the respective data-amps DAe, DAo into serial signal; to be supplied successively to the multiplexer MUX.

The multiplexer MUX is located close to the i/o pad PA and constitutes a component of the output circuit together with buffers and the like which are not shown, and its two input terminals are connected to parallel-serial conversion circuits S-Pe, S-Po while its output terminal is connected to the i/o pad PA. Therefore, the outputs from the output terminal are output data to the external environment. The multiplexer MUX receives the system reference clock CLK signal via its clock input terminal, and alternately selects and outputs data input in its two input terminals during the rise and fall phases of the system reference clock CLK. Accordingly, the multiplexer MUX outputs to the i/o pad PA even data received from the parallel-serial conversion circuit P-Se during the rise phases of the system reference clock CLK, and outputs odd data received from the parallel-serial conversion circuit P-So during the fall phases of the system reference clock CLK, so that serial data comprised by one bit-data corresponding to rise- and fall-phases are output to the external environment.

The wiring length for the connection between the multiplexer MUX and the parallel-serial conversion circuit P-Se is made shorter than the wiring length for the connection between the demultiplexer DE-MUX and the serial-parallel conversion circuit S-Pe (in other words, the parallel-serial conversion circuit P-Se is located closer than the serial-parallel conversion circuit S-Pe to the i/o circuit). Similarly, the wiring length for the connection between the multiplexer MUX and the parallel serial conversion circuit P-So is made shorter than the wiring length for the connection between the demultiplexer DE-MUX and the serial-parallel conversion circuit S-Po. The present memory device thus compensates for the differences in write and read operations in linking the internal environment to the external environment. That is, the write-process can be carried out at the internal timing given by the internal clock of the memory device according to given information such as address signals, write-data, and write commands given from the external environment. On the other hand, the read-process must be carried out in such a way as to output read-data within a predetermined time interval from information such as address signals and read commands given from the external environment. Therefore, the wiring length of the signal transmission lines of the read-data is shorter and adjusted such that the read-data can be delivered more rapidly within the severe time restriction placed by the external environment. Accordingly, the present memory device is designed so that the read-data will arrive at the terminal means for external output in a shorter time phase than the time phase required for the write-data so that the output write-data from the memory device will be compatible with the speed of the external environment.

Figure 2:
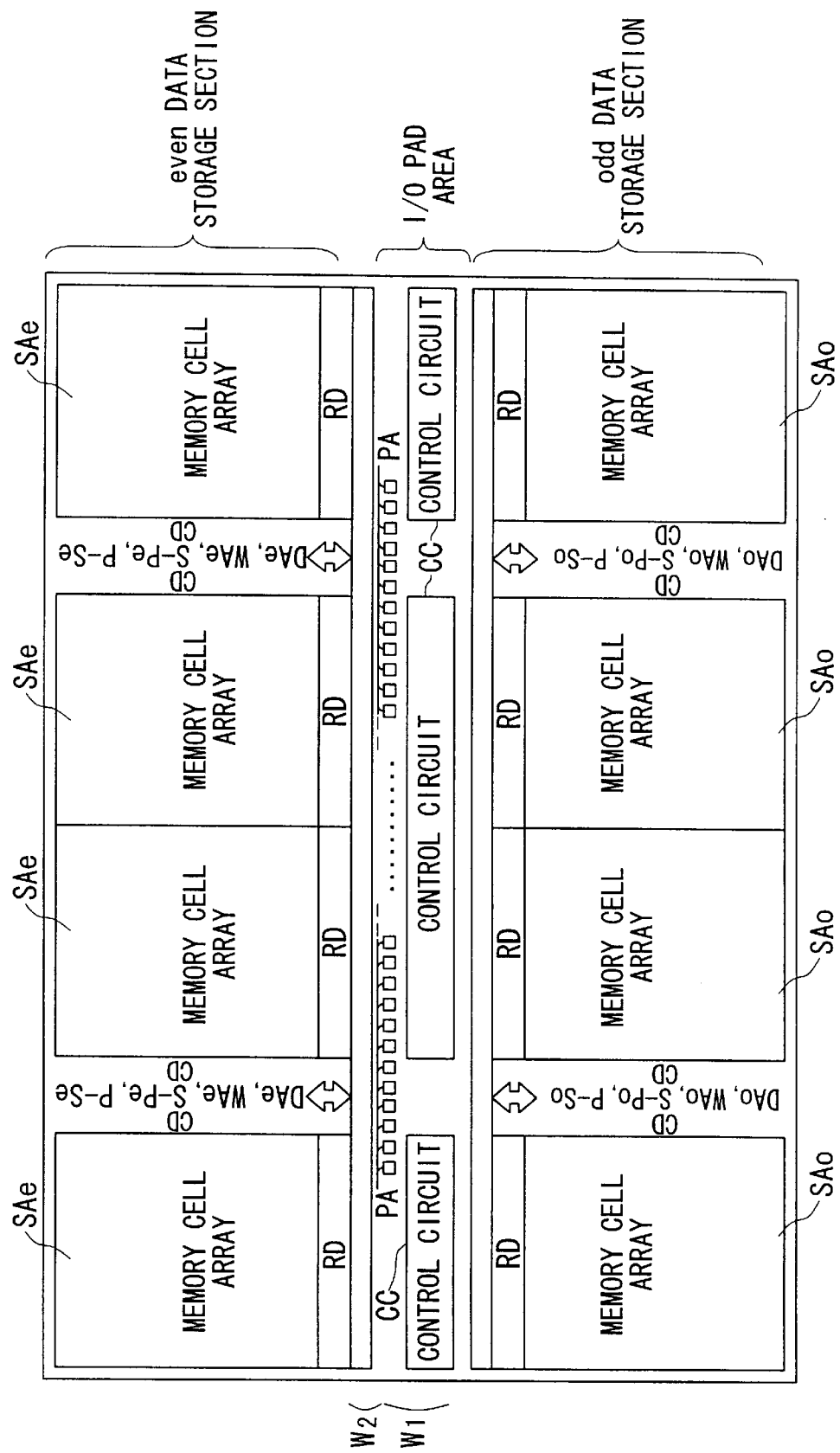
FIG. 2 is an example of the layout of a dynamic random access memory (DRAM) structure based on the circuit configuration of the semiconductor memory device shown in FIG. 1.

FIG. 2 shows a layout for a DRAM layout adopting the design of the present memory device. In this figure, the same references as those used above are used to refer to parts corresponding to the parts of FIG. 1.

A control circuit CC is comprised by: a delayed locked loop (DLL) which includes a timing circuit and a clock adjusting circuit; an internal reference voltage generation circuit for providing a reduced voltage; a step-up circuit; a back bias generator (BBG) which is a voltage generator for the substrate base; redundancy fuses; and other control functional circuits. In this layout, the control circuit CC is disposed on the odd-side of the memory cell arrays SAo in the central region, while the i/o pads PA are disposed on the even-side of the memory cell arrays SAe. Also, although not shown in the diagram for simplification, an input circuit containing the demultiplexer DE-MUX and the like as well as an output circuit containing the multiplexer MUX and the like are disposed on both lateral regions of each i/o pad PA. Here RD refers to a raw address decoder, CD to a column address decoder, and they activate memory cells corresponding to externally specified write-addresses and read-addresses.

The serial-parallel conversion circuits S-Pe, write-amps WAc, data-amps DAe and parallel-serial conversion circuits P-Se are disposed adjacent to the memory cell arrays SAe (refer to FIG. 2, top row). On the other hand, the serial-parallel conversion circuits S-Po, write-amps WAo, data-amps DAo and parallel-serial conversion circuits P-So are disposed adjacent to the memory cell arrays SAo (refer to FIG. 2, bottom row). Accordingly, a storage section for even data is created on the side of the memory cell arrays SAe, and a storage section for odd data is created on the side of the memory cell arrays SAo. These storage sections are referred to, respectively, as even data storage section and odd data storage section hereinafter.

When data are to be read out from these memory storage sections, the bit-data to be output first is stored close to the i/o pad PA. In other words, because the i/o pads PA are disposed close to one storage section of the memory cell arrays, the storage section is chosen for storing the lead-bit data (of one word to be read out, see below for explanation) which is the bit-data to be output first (the first bit of read-data is pre-determined according to the specification and system construction).

Here, one word of read-data relates to an aggregate of data to be continually output in one access attempt by an external environment. For example, suppose that a semiconductor memory device is comprised by thirty-two memory blocks (each block has the structure shown in FIG. 1) and is used in the layout shown in FIG. 2, and each block can read/write 8 bits of data (data exchanged during 4 clock pulses) at once in one access attempt, then a total data width of 32 bits can be read/written in each of the four rise and fall phases contained in one access attempt. If this data width is referred to as 1 byte, 8 bytes of data can be read out continually in one external access attempt, meaning that one word constitutes data comprised by 8 bytes (or 32×8 bits).

That is, in the present memory device, one word is assigned to one address, and external devices such as CPUs, which are connected to and access the present memory device, process one byte of data per one address. In the example given above, when an address is specified by an external source, eight bits of contiguous addresses are processed in each block without having to respond to an input of next address data. In each memory block during this processing, 8-bit-data exchanged (input or output) every 4-clock cycles are processed all at once so that for each external exchange of a 1-word data cycle, the internal processing speed of about four cycles can be obtained. It should be noted, however, that contiguous address data are not limited to 8 bits. Also the data width of one byte may be comprised by 4, 8, 16, 32, 64 or more bits to correspond with the number of blocks provided in the layout of the device.

The layout example shown in FIG. 2 relates to a specific example of a case of the first bit of read-data being an even bit when reading one word (comprised by a given number of bits) in one read operation. In this case, the i/o pads PA are placed closer towards the even data storage section on the even-side of memory cell arrays SAe, and the odd data storage section on the odd-side of memory cell arrays SAo is further away from the i/o pads PA, because of the presence of the intervening control circuit CC. Therefore, each of the wiring lengths between the parallel-serial conversion circuits S-Pe and the multiplexers MUX is longer than each of the wiring lengths between the parallel-serial conversion circuits P-So and the multiplexers MUX.

Thus, various components such as individual memory sections and i/o pads are placed appropriately in the present semiconductor memory device so that output terminals of the parallel-serial conversion circuits P-Se, P-So are connected to the input terminals of the multiplexer MUX that is closest to the i/o pad PA. Therefore, the bit of read-data to be output first is always forwarded through the parallel-serial conversion circuit located closer to the multiplexer MUX so as to provide the shorter connection line.

2. Description of the Memory Device Operation (1) Write Operation

Next, the operation of the memory device will be explained. First, for the write operation, write-data are input from the external environment to the i/o pad PA together with the write-address for the lead-bit data to specify the memory cells to be used.

Then, the write-data are divided into even-bit-data and odd-bit-data by the demultiplexer DE-MUX, and the even data are forwarded to the serial-parallel conversion circuit S-Pe and the odd data are forwarded to the serial-parallel conversion circuit S-Po. Accordingly, even data and odd data received in the serial-parallel conversion circuits S-Pe, S-Po are converted into respective parallel data, and are stored in the specific memory cells in the memory cell arrays SAe, SAo by way of the write-amps WAe, WAo.

Here, the specific memory cells refer to cells that are identified by above write-address and flow addresses thereto. These memory cells are determined by pre-allocating the addresses to the regions for even-data and odd-data within the memory cell arrays SAe, SAo respectively.

(2) Read Operation

For the read operation, when the read-address of the lead-bit data is specified by the external environment, even data in the read-data are output from the memory cells to correspond to the specified address in the memory cell array SAe, and similarly, odd data are output from the corresponding memory cells in the memory cell array SAo. These data are output to respective parallel-serial conversion circuits P-Se, P-So by way of the data-amp DAe, DAo.

Suppose that the lead-bit data to be output first is a bit-data from the even data and that the even data storage section is placed closer to the i/o pad PA (such as the one shown in FIG. 2). In this case, the parallel-serial conversion circuit P-Se accepts even data from the data-amp DAe and, when the internal clock CLKe rises, immediately forwards the first read-data (lead-bit data) among the accepted even data to the multiplexer MUX.

Then, the first read-data is transmitted from the parallel-serial conversion circuit P-Se through the shorter line path and is delivered to the multiplexer MUX rapidly. By this action, the multiplexer MUX is placed in a state to perform a data selection/output operation, and when the system reference clock CLK rises, the first read-data is output to the i/o pad PA.

In the meantime, the parallel-serial conversion circuit P-So accepts odd data from the data-amp DAo and, when the internal clock CLKo rises, immediately forwards the first bit of the odd data (i.e., the second read-data to be output) to the multiplexer MUX. The second read-data is transmitted through the longer line path from the parallel-serial conversion circuit P-So to the multiplexer MUX.

Here, it should be noted that, on a chronological time-scale, when the multiplexer MUX selects and outputs odd data, a half period of the system reference clock CLK has already elapsed after the multiplexer MUX had selected and output the first read-data. Therefore, it is sufficient for the second read-data to reach the multiplexer MUX within that time span. This will be explained below in reference to a numerical example.

The difference in the arrival times of data from the parallel-serial conversion circuits P-Se, P-So to the multiplexer MUX is of the order of 0.1 ns for a circuit layout of 1500 μm width of the central region and the i/o pad PA is located at a location defined by W1:W2=1200:300 in FIG. 2. When the system reference clock CLK is operating at 400 MHz, a half period is 1.25 ns, and therefore, after outputting the first read-data, the second read-data is output from the multiplexer MUX when 1.25 ns has elapsed. This time span is quite sufficient for the second read-data to be delivered to the multiplexer MUX so that the multiplexer MUX can select and output the second read-data without any problems to the i/o pad PA.

Subsequently, even data are successively output from the parallel-serial conversion circuit P-Se synchronously with the fall phases of the internal clock CLKe, and odd data are successively output from the parallel-serial conversion circuit P-So synchronously with the rise phases of the internal clock CLKo. These data are selected alternately in the multiplexer MUX so as to be synchronized with the rise and fall phases of the system reference clock CLK, and high-speed serial data under the controlled pulses of the system reference clock CLK are output to the i/o pad PA.

The above processes describe the write and read operations of the present memory device. In the present memory device, because the first read-data (lead-bit data) is always forwarded through the shorter line path to the output circuit, regardless of the read-address, the read-process is always carried out in the same manner so that the first read-data is output rapidly. Therefore, the operational speed characteristic is determined by the read-step of the memory cell array which is closer to the i/o pad, that is, the memory access speed is determined by the faster operating read-cells of the two memory cell arrays.

In other words, the i/o pad PA is disposed at a position closer to one of the storage sections in the area between the storage sections (in the i/o pad region between the memory cell array SAe and SAo), and in the present memory device, that storage section is used to store the read-data to be output first. Therefore, the storage section is also closer to the multiplexer and the like adjacent to the i/o pad PA. According to this, the present memory device makes it possible to operate at high speed so that the operational characteristics are determined by the read-step of the storage section which is closer to the output terminal. That is, the characteristics are determined by the faster operation of the read-step.

For example, in the example of a system operating at 400 MHz, the operational speed is increased by the reduction in operation time of about 0.1 ns. In more detail, when the system reference clock is operating at 400 MHz, the first read-data must be present definitely at the input terminal of the multiplexer MUX about 0.625 ns earlier than the rise-edge of the system reference clock, which is the timing of output to external environment. On the other hand, the above time difference of 0.1 ns for signal arrival represents 16% of 0.625 ns, which is not an insignificant amount considering the possible scatter caused by production tolerance. For this reason, if the first read-data is delivered through the longer line path, output cannot always be guaranteed so that the operating speed is inevitably settled to a level 0.1 ns slower. In the present memory device, because the first read-data is always output reliably through the shorter line path, the first read-data can be defined faster at the input terminal of the multiplexer MUX and can be output reliably. Therefore, the operating speed can be made faster by 0.1 ns.

Figure 10:
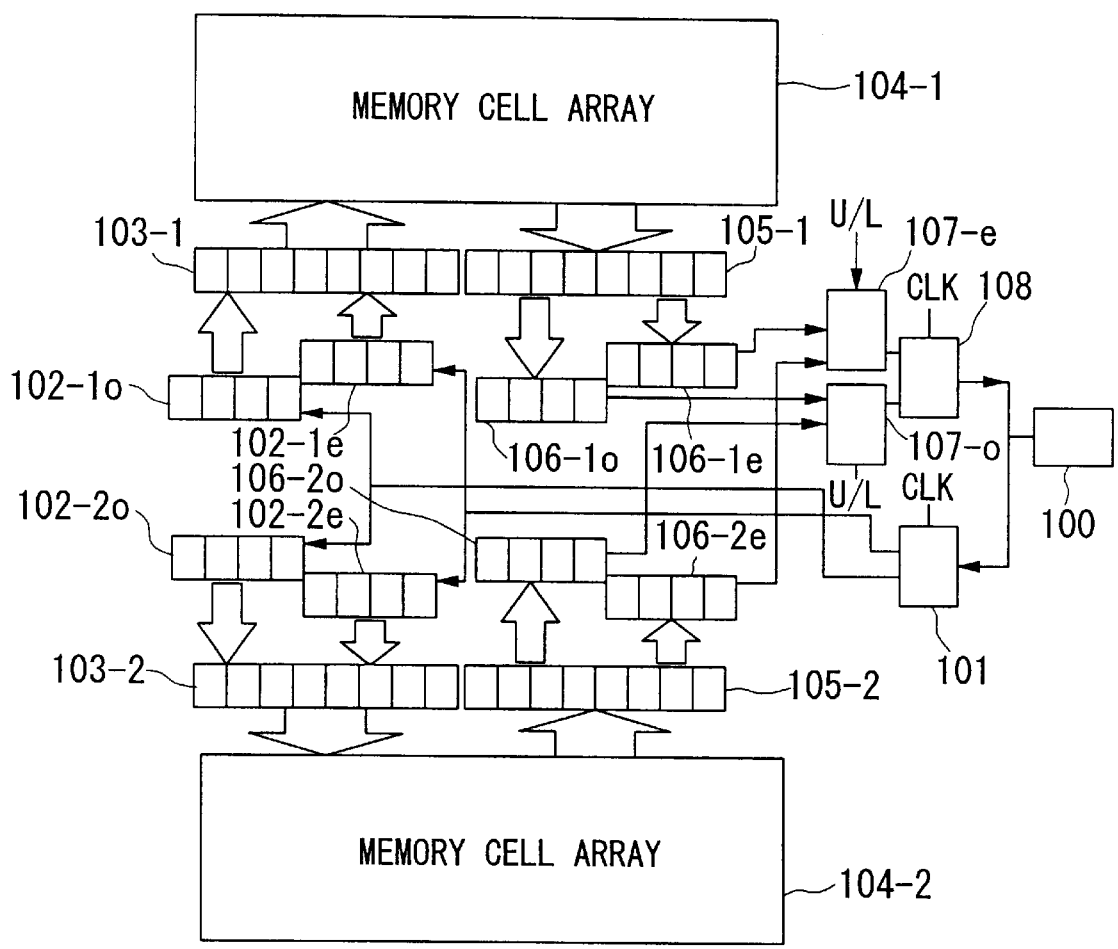
FIG. 10 is a schematic diagram of the conventional semiconductor memory device.

Also, in the present memory device, because one memory cell array is dedicated to storing the even data while the other cell array is dedicated to storing the odd data, it is not necessary to provide a multiplexing device (corresponding to multiplexers 107-e, 107-o in FIG. 10) for outputting either the even data or odd data. Accordingly, the present memory device enables not only a reduction in the number of components need for outputting read-data so that the operational speed is further increased, but also simplifies and downsizes the circuit structure. For example, in the above example of a 400 MHz system speed, the operating speed of the memory device is increased by shortening the access speed by 0.2 ns.

Additionally, in the present memory device, because the device structures between the demultiplexer DE-MUX to multiplexer MUX are provided completely independently for processing the even data or odd data, two separate internal clocks CLKe and CLKo can be appropriately adjusted individually. Accordingly, it is possible to adjust the internal clock CLKe with reference to only its fall-edge, while the internal clock CLKo can be adjusted with reference to only its rise-edge, thereby producing an optimal performance of the internal operation of the memory device easily. In other words, because the structure for processing during rise phases of the internal clock and the structure for processing during fall phases of the internal clock are independent respectively, it is easy to adjust the independently internal clocks individually and to provide them for controlling data outputting from each storage section. So the present memory device can perform appropriate reading operations.

3. Specific Examples of the Constituting Elements

In the following, some specific examples of various constituting components of the present memory device will be explained.

(1) Serial-parallel Conversion Circuit

Figure 3:
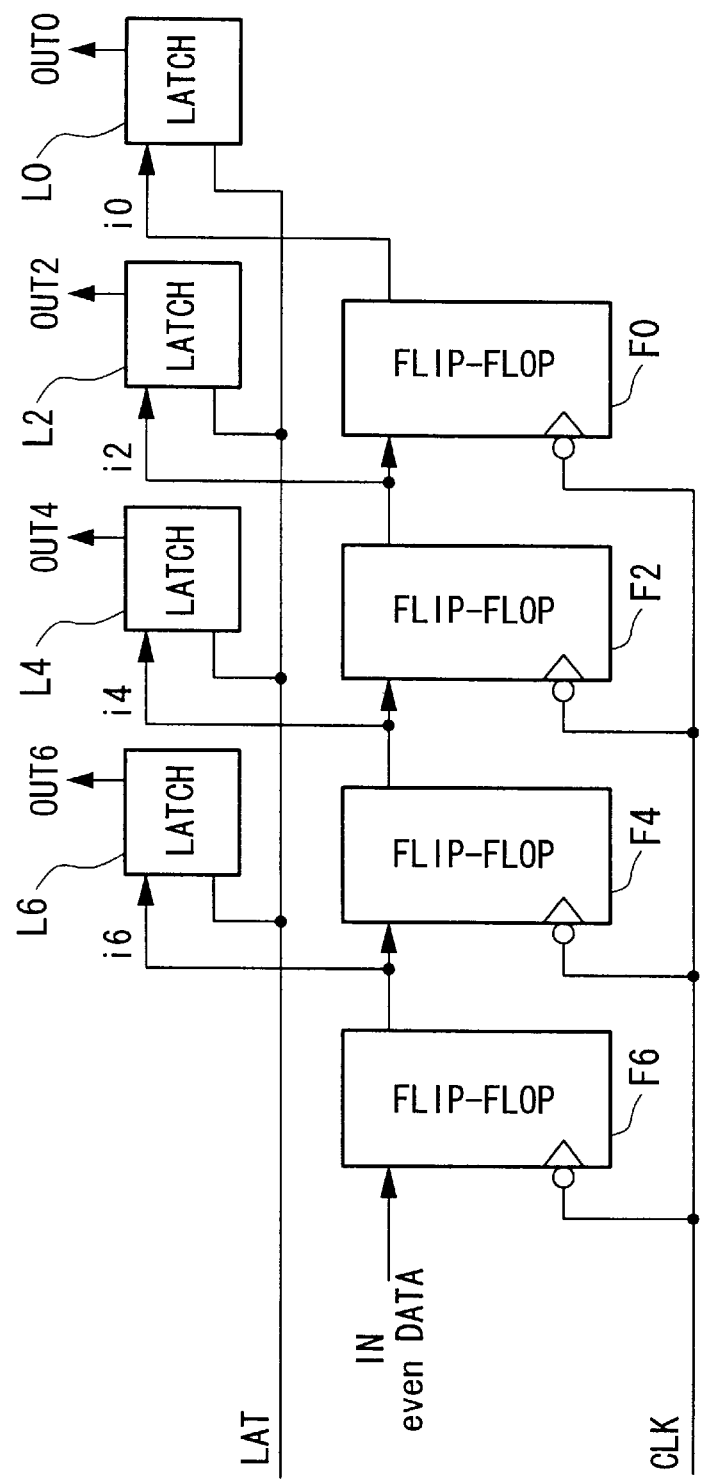
FIG. 3 is a specific example of the serial-parallel conversion circuit S-Pe in the semiconductor memory device shown in FIG. 1.

A specific example of the serial-parallel conversion circuit S-Pe is shown in FIG. 3. This is an example in which 8-bit-data are written in one write-step into the memory device. That is, the serial-parallel conversion circuit S-Pe converts only the even data of the write-data into parallel data so as to process 4 bits of the 8 bits of write-data using 4 stage flip-flops F6, F4, F2, F0 and four latches L6, L4, L2, L0.

Flip-flops F6, F4, F2, F0 are negative edge triggered D-type flip-flop circuits, and each circuit receives a clock signal of the system reference clock CLK at their input terminal, and accepts input data at the fall-edge of the pulse, and outputs the data to aft-stages. The input terminal of the flip-flop F6 is connected to the demultiplexer DE-MUX (not shown in FIG. 3), and receives even data as input data IN. On the other hand, input terminals of the other flip-flops F4, F2, F0 are connected to the output terminals of the respective fore-stages so that the output signals from the respective flip-flops are forwarded as input data i6, i4, i2, i0 to respective latches L6, L4, L2, L0.

Latches L6, L4, L2, L0 receive respective latch signal LAT, and when this signal reaches the high-level H, latch the input data i6, i4, i2, i0 supplied to the input terminals. The input terminals of the latches L6, L4, L2, L0 are connected to the respective output terminals of the flip-flops F6, F4, F2, F0 so that the output signals from the flip-flops are forwarded as input data i6, i4, i2, i0. Also, the latched data from the latches F6, F4, F2, F0 are output as output data out6, out4, out2, out0 to the write-amp WAe (not shown) so that the output data out6, out4, out2, outO are written in the memory cell array SAe through the write-amp WAe.

Figure 4:
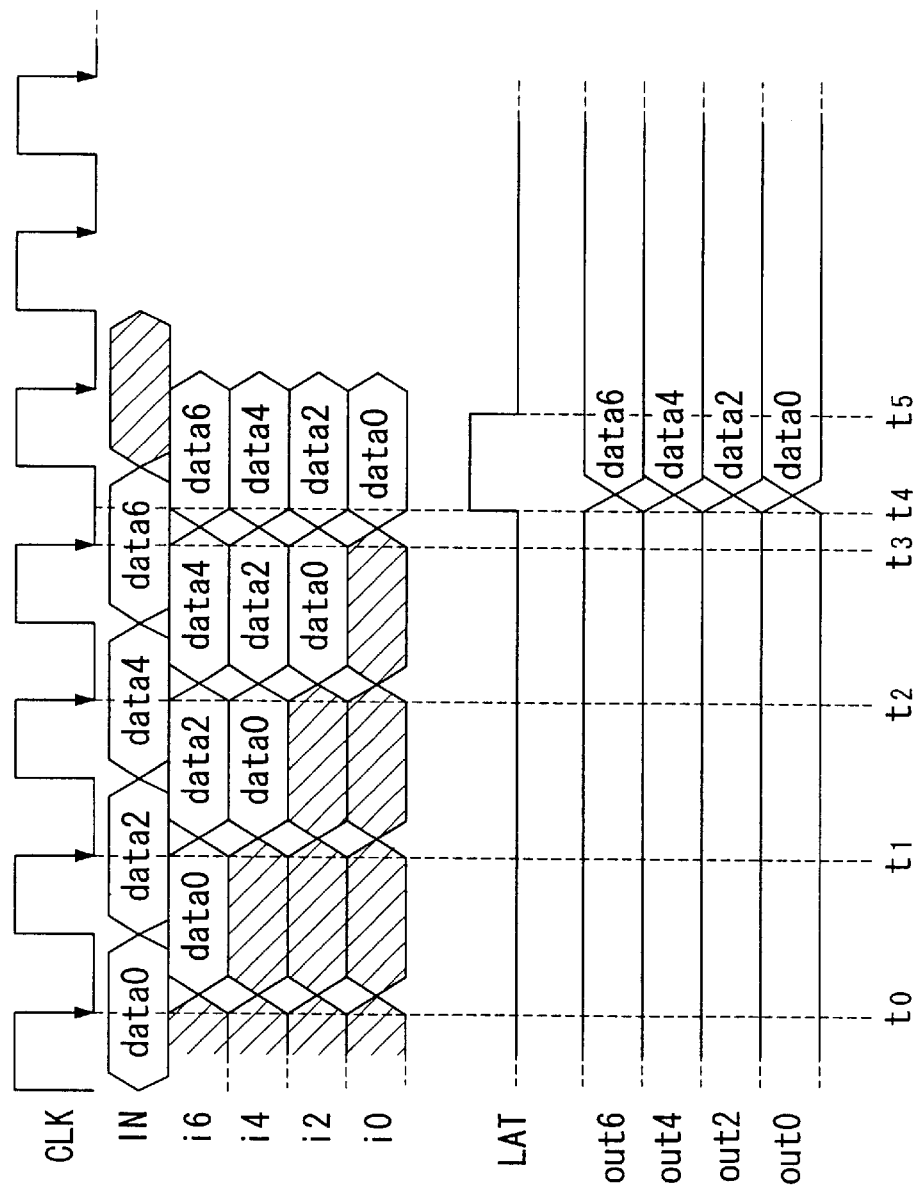
FIG. 4 is a timing chart showing the operation of the serial-parallel conversion circuit shown in FIG. 3.

In the serial-parallel conversion circuit S-Pe of such a structure, 4 bits serial even data forwarded from the demultiplexer DE-MUX are converted into parallel data. The timing chart for the conversion process is shown in FIG. 4. First, the first bit of the even data, "data0" is supplied as input data IN, and, within the supply duration, the system reference clock CLK falls at time t0 and the flip-flop F6 accepts and outputs "data0", and the input data i6 for flip-flop F4 and latch L6 becomes "data0".

Next, the second bit of the even data "data2" is supplied, and, within the supply duration, the system reference clock CLK falls at time t1, and similarly the input data i6 to flip-flop F4 and latch L6 becomes "data2" as in the process described above. The input data "data0" which was immediately ahead of input data i6 is fetched by flip-flop F4 and output to become input data i4 for flip-flop F2 and latch L4.

In the subsequent steps, the data are similarly shifted for each supply of new even data at the fall time of the system reference clock CLK. That is, at time t2, input data i6 becomes "data 4" and the immediately preceding data i6, i4 become outputs of flip-flops F4, F2, and input data i2, i4 become "data2", "data0"; at time t3, input data i6 becomes "data6" and the immediately preceding data i6, i4, i2 become outputs of flip-flops F4, F2, F0, and input data i4, i2, i0 become "data4", "data2", "data0".

When the data shift at time t3 is completed, the latch signal LAT rises at time t4. Then, the "data6", "data4", "data2", "data0" which are input data i6, i4, i2, i0 at this instant, are latched respectively by the latches L6, L4, L2, L0, and are output as out6, out4, out2, out0 in one step. Accordingly, 4-bit serial even data "data0", "data2", "data4", "data6" are converted to parallel data to be output to write-amp WAe. Here, the latch signal LAT falls at time t5, but the output bits of latches L6, L4, L2, L0 are retained during the write process.

The specific example of the serial-parallel conversion circuit S-Pe has been described above, but the serial-parallel conversion circuit S-Po can be constructed in the same manner using 4-stage positive edge triggered D-type flip-flop circuits instead of the flip-flops F6, F4, F2, F0 used above.

(2) Parallel-Serial Conversion Circuit

Figure 5:
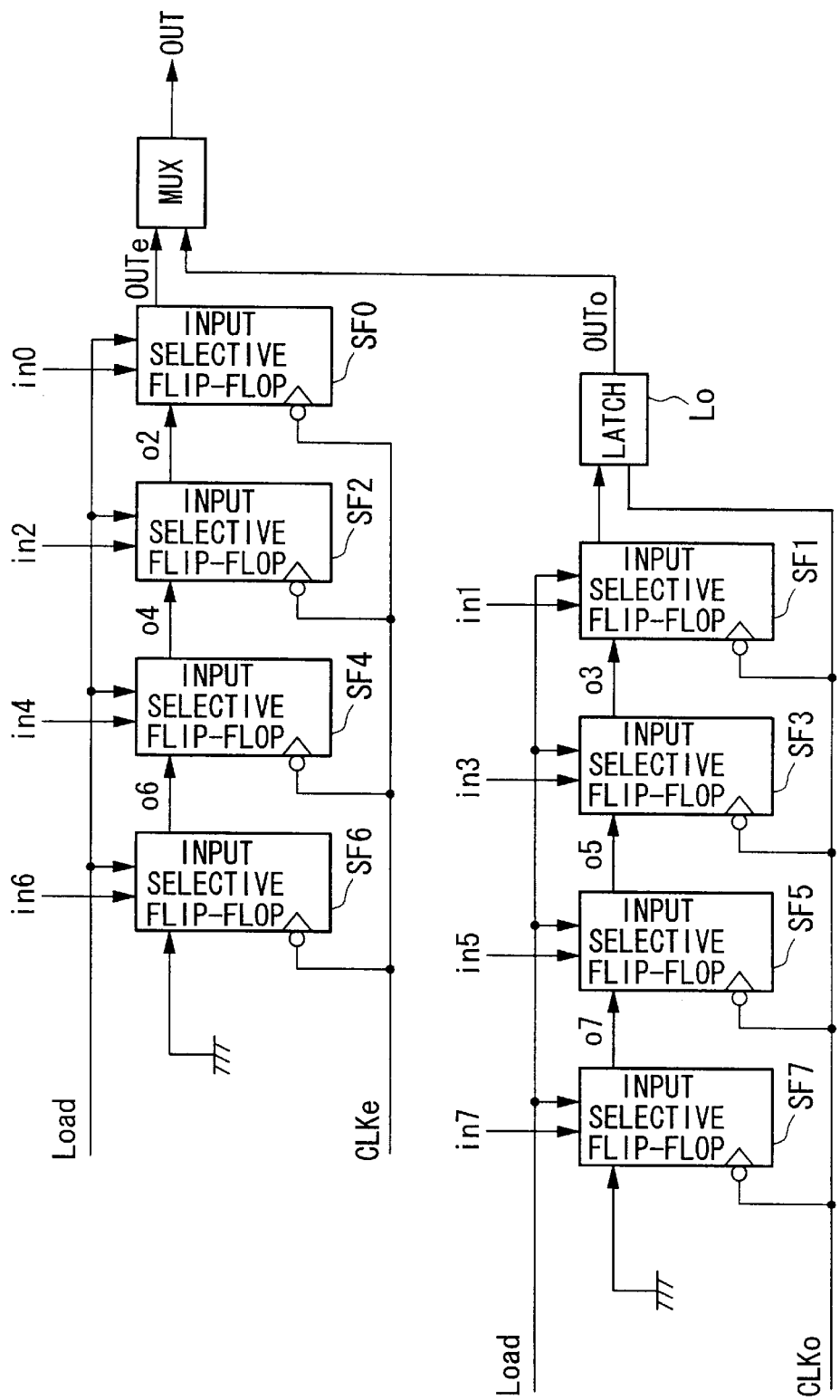
FIG. 5 is a specific example of the parallel-serial conversion circuit P-Se in the semiconductor memory device shown in FIG. 1.

A specific example of the parallel-serial conversion circuits P-Se, P-So is shown in FIG. 5. This is also an example in which 8-bit-data are written in one write-step into the memory device, and corresponds to the example of the serial-parallel conversion circuit described above. That is, the parallel-serial conversion circuit P-Se converts only the even data of the read-data into serial data, and comprises 4 stage input selective flip-flop circuits SF6, SF4, SF2, SF0 having respective selectors so that 4 bits (even data) of the 8 bits of read-data are processed (refer to FIG. 5, top row). On the other hand, the parallel-serial conversion circuit P-So converts only the odd data of the read-data into serial data, and comprises 4 stage input selective flip-flop circuits SF7, SF5, SF3, SF1 having respective selectors and the latch Lo so that 4 bits (odd data) of the 8 bits of read-data are processed (refer to FIG. 5, bottom row).

Each of the flip-flops SF0 to SF7 is provided with two input terminals, and has a selector to select data input into one of the input terminals and outputs the one data. Of those flip-flops, those located in the even-side of the parallel-serial conversion circuit P-Se are SF6, SF4, SF2, SF0 whose one input terminals are connected to the data-amp DAc (not shown in FIG. 5), and are supplied with 4 bits parallel even data as input data in6, in4, in2, in0 forwarded from the memory cell array SAe. On the other hand, those located in the odd-side of the parallel-serial conversion circuit P-So are SF7, SF5, SF3, SF1 whose one input terminals are connected to the data-amp DAo (not shown in FIG. 5), and are supplied with 4-bit parallel odd data as input data in7, in5, in3, in1 forwarded from the memory cell array SAo.

Also, other input terminals of the flip-flops SF6, SF7 are connected to a low-level electrode such as a ground potential, and other input terminals of the flip-flops SF0 to SF5 are connected to respective output terminals of the respective fore-stages so as to be supplied with output data o2 to o7 from the respective preceding flip-flops. The output terminal of the last flip-flop SF0 on the even-side is connected to one of the input terminals of the multiplexer MUX, and its output data OUTe is output through the multiplexer MUX to the i/o pad PA as output data OUT.

On the other hand, the output terminal of the last flip-flop SF1 in the odd-side is connected to the input terminal of latch Lo, and the output terminal of latch Lo is connected to the other input terminal of the multiplexer MUX. The latch Lo receives the internal clock CLKo, and holds the supplied data in the input terminal at the rise-edge of the internal clock CLKo so as to supply the data to the multiplexer MUX. Accordingly, the data from the flip-flop SF1 are output as output data OUTo from the odd-side at the rise phases of the internal clock CLKo, and then the output data OUTo are output to the i/o pad PA as output data OUT through the multiplexer MUX.

Here, flip-flop SF0 corresponds to a means for holding input data in0 which is the lead-bit data of the contiguous read-data, so that it is placed closer to the i/o pad PA (and the multiplexer MUX) than those flip-flops SF2, SF4, SF6 that hold respective input data in2, in4, in6 (these input data will become the following output data from the even-side). Accordingly, the time taken by the lead-bit data to reach the i/o pad PA is shortened so as to shorten the time required for read-steps. Also, in the odd-side, flip-flop SF1 (and latch Lo) corresponds to a means for holding the input data in1 which is the lead-bit data of odd data (the second bit data of the contiguous read-data), and is placed closer to the i/o pad PA (and the multiplexer MUX) than those flip-flops SF3, SF5, SF7 that hold respective input data in3, in5, in7 (these input data will become the following output data from the odd-side).

That is, of the data holding means comprising the parallel-serial conversion circuits P-Se, P-So, the lead-bit holding means is placed closer to the i/o pad PA than the succeeding data holding means. Accordingly, the lead-data of the contiguous read-data can be output faster than other data so as to respond faster to the external environment.

Also, data selection in each of the flip-flops SF0 to SF7 is performed according to the load signal Load. The load signal Load is maintained at the high-level H during specific phases of the beginning of the read-step. During this phase, flip-flops SF0 to SF7 select input data in0 to in7, and during the remaining phases, the load signal Load is at the low-level so that the flip-flops SF0 to SF7 select input data from the other data input terminals. Accordingly, flip-flops SF0 to SF7 perform data selection according to the load signal Load, and forward data to the aft-stages at the fall-edges by receiving clock signals from the internal clock CLKe or the internal clock CLKo.

Using the circuit structure described above, 4-bit parallel even data and odd data forwarded from the data-amps DAe and DAo are converted into serial data. The timing chart for these steps is shown in FIG. 6.

Figure 6:
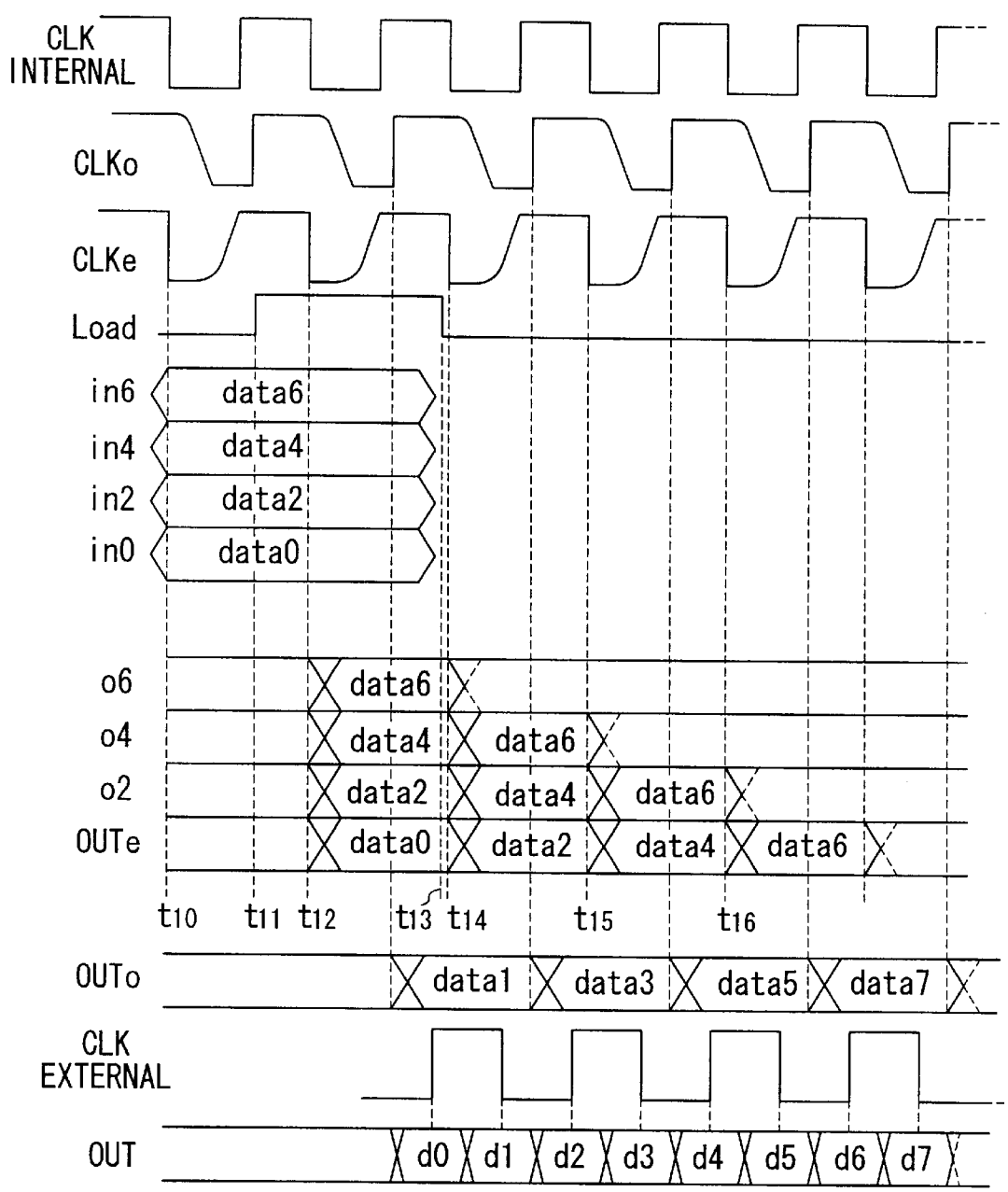
FIG. 6 is a timing chart showing the operation of the parallel-serial conversion circuit shown in FIG. 5.

In FIG. 6, the upper-most "CLK (internal)" refers to the system reference clock CLK which is captured from the external environment and used inside of the memory device. The penultimate "CLK (external)" refers to the system reference clock CLK operating in the external environment. Also, because the odd-side outputs data during the rise phases of the internal clock CLKo, adjustment of rise-edges is more important, and therefore, the rise-edges of the internal clock CLKo are made sharp as illustrated in the diagram while the fall-edges are not especially important and are somewhat curved. On the other hand, because the even-side outputs data during the fall phases of the internal clock CLKe, adjustment of fall-edges is more important, and therefore, the fall-edges of the internal clock CLKe are made sharp as illustrated in the diagram while the rise-edges are not especially important and are somewhat curved. Thus, in the present memory device, only the edges necessary for highspeed operation are sharpened while the opposing edges are made less sharp so as to economize on power consumption and reduce noise in the memory device. Specific construction to achieve such waveforms of the clocks CLKo and CLKe will be explained later. Also, the bottom-most "OUT" refers to data output from the multiplexer MUX to be output data from the i/o pad PA to external environment, and "d0", "d1", . . . , "d7" refer to abbreviated forms of "data0", "data1", . . . "data7".

In FIG. 5, the section comprised by flip-flops SF0, SF2, SF4, SF6 on the even-side and the section comprised by flip-flops SF1, SF3, SF5, SF7 on the odd-side are different in the processing of even or odd data but the processing methodology is the same in both cases. For this reason, the timing chart shown in FIG. 6 illustrates only the steps taken in the even-side, in terms of CLKe to OUTe. In the following, processing operation for converting the parallel data supplied from the clata-amp DAe and DAo into serial data in the respective parallel-serial conversion circuits P-Se, P-So will be explained.

First, the bit data of even-data "data6", "data4", "data2", "data0" begin to be supplied as input data in6, in4, in2, in0 from the data-amp DAe at time t10. At time t11 during the phase, the load signal Load is turned to a high-level H, and at time t12, the internal clock CLKe falls. Then, flip-flops SF6, SF4, SF2, SF0 select respective input data in6, in4, in2, in0 and accepts input data "data6", "data4", "data2", "data0" to output. Accordingly, output data o6, o4, o2 become "data6", "data4", "data2", and output data OUTe becomes "data0".

In this case also, suppose that the first read-data to be output is even bit (first bit-data "data0"). In the multiplexer MUX, it is necessary to select "data0" first, therefore, "data0" for output data OUTe must be transmitted from the flip-flop SFO to the multiplexer MUX immediately at time t12 according to the fall-edge of the internal clock CLKe.

In view of these requirements, the even data storage section is placed close to the i/o pad PA in the present memory device so that the output data OUTe is able to reach the multiplexer MUX rapidly. Therefore, immediately after the fall-edge of the internal clock CLKe at time t12, the first read-data "data0" is able to be output to the i/o pad PA to coincide with the system reference clock CLK (external). The data output according to this operation is corresponds to "d0" of output data OUT in FIG. 6.

During this period in the odd-side, similar operations are being carried out. That is, the bit data of the odd data to be output first "data1" is output from the flip-flop SF1 when the internal clock CLKo falls, and is fetched by the latch Lo at the following rise-edge of the internal clock CLKo to be output to multiplexer MUX (refer to "data1" of the output data OUTo in FIG. 6). The path length between the multiplexer MUX and odd-side parallel-serial conversion circuit P-So is longer than the even-side path length to the parallel-serial conversion circuit P-Se. But the output data OUTo, which had become "data1", from the latch Lo needs to arrive at the multiplexer MUX after output of "data0", so there is sufficient phase available for this step as discussed earlier.

Subsequently, suppose that the load signal Load turns to L-level at time t13 and the internal clock CLKe rises at time t14, the flip-flop SF6 selects an input signal from the L-level electrode and outputs the data, and the flip-flops SF4, SF2, SF0 respectively select o6, o4, o2 and output the data. Accordingly, the output data o6 is fixed to the L-level signal and looses its meaning as output data, while the output data o4, o2, OUTe become "data6", "data4", "data2", and "data2" is forwarded to the multiplexer MUX.

In the subsequent steps, flip-flops SF6, SF4, SF2, SFO select the L-level electrode signal or an input from a fore-stage flip-flop at every fall-edge of the internal clock CLKe, and output the selected data so that the data are shifted successively. Specifically, at time t15, output data o4, o2 are shifted to output data o2 and OUTe, respectively, so that "data4" is forwarded to the multiplexer MUX. Then the output data o2 is shifted to output data OUTe at time t16, and "data6" is forwarded to the multiplexer MUX.

According to the steps described above, 4-bit parallel data "data0", "data2", "data4", "data6" are converted to serial data and are supplied to the multiplexer MUX. In the multiplexer MUX, even data "data0", "data2", "data4", "data6" are successively output to the i/o pad PA synchronously with the rise-edges of the system reference clock CLK.

Similarly, 4-bit parallel data "data1", "data3", "data5", "data7" in the odd-side are converted to serial data. However, instead of being forwarded from the flip-flop SF1 directly to the multiplexer MUX, these data are fetched successively by the lath Lo to be supplied to the multiplexer MUX at the rise-edges of the internal clock CLKo (refer to the internal clock CLKo and output data OUTo in FIG. 6). Accordingly, odd data "data1", "data3", "data5", "data7" are output successively from the multiplexer MUX to the i/o pad PA synchronously with the fall-edges of the system reference clock CLK.

Specifically, the multiplexer MUX successively outputs "data0", "data2", "data4", "data6" supplied from the parallel-serial conversion circuit P-Se during the phases of the rise-edge to the fall-edge of the system reference clock CLK, and successively outputs "data1", "data3", "data5", "data7" supplied from the parallel-serial conversion circuit P-So during the phases of the fall-edge to the rise-edge of the system reference clock CLK.

(3) Multiplexer i. First Example of the Structure

Figure 7:
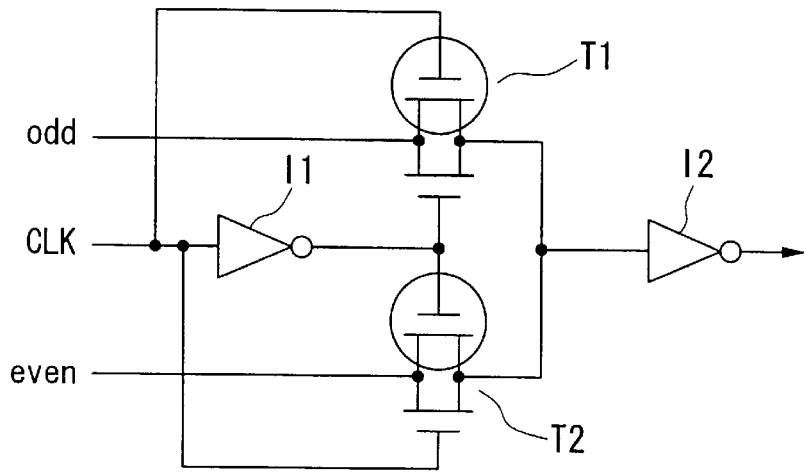
FIG. 7 is a schematic diagram of a first example of the configuration of the multiplexer MUX in the semiconductor memory device shown in FIG. 1.

A first example of the structure of the multiplexer MUX is shown in FIG. 7. An inverter I1 is provided to invert the system reference clock CLK in the multiplexer MUX. The input-side of the inverter I1 is connected to the signal supply line (referred to as the clocking line) of the system reference clock CLK, and the output-side is connected to the transfer gates T1, T2. The transfer gate T1 is a transmission gate comprised by a p-channel transistor connected alternately with a n-channel transistor as illustrated in FIG. 7, where the gate electrode of the p-channel transistor is connected to the clocking line, and the gate electrode of the n-channel transistor is connected to the output-side of the inverter I1. The transfer gate T2 is also a similar transmission gate, but the gate electrode of the n-channel transistor is connected to the clocking line, and the gate electrode of the p-channel transistor is connected to the output-side of the inverter I1.

Also, the input-side of the transfer gate T1 is connected to the data line supplied with odd data from the parallel-serial conversion circuit P-So (referred to as the odd-line hereinafter), and the input-side of the transfer gate T2 is connected to the data line supplied with even data from the parallel-serial conversion circuit P-Se (referred to as the even-line hereinafter). The output-sides of the transfer gates T1, T2 are both connected to the input-side of the inverter 12. The output-side of the inverter 12 is connected to the i/o pad PA (not shown), and the inverter 12 inverts the data input through the transfer gate T1 or T2 and outputs the inverted data.

Here, even data and odd data are supplied from the parallel-serial conversion circuits P-Se, P-So under the control of the internal clocks CLOc, CLOo as described above. For this reason, the operating parameters of the internal clocks CLOe, CLOo are micro-adjusted in advance so that the rise-edges of the system reference clock CLK from the clocking line are located within the supply phase s of even data corresponding to the fall phases of the internal clock CLKe respectively, and similarly, the fall-edges of the system reference clock CLK are located within the supply phases of odd data corresponding to the rise phases of the internal clock CLKe respectively. The timing chart shown in FIG. 6 has been produced by this micro-adjustment of clocks CLKe, CLKo.

In the structure described above, even data and odd data are supplied to the multiplexer MUX, and one or the other of these two groups of data is output according to the system reference clock CLK. In the example given above, the lead-bit data of even data (the first read data) is supplied first and arrives in the multiplexer MUX, but immediately afterwards, the system reference clock CLK rises so that the transfer gate T1 becomes nonconductive and T2 becomes conductive. Accordingly, the first read data supplied through the even-line is output through the inverter 12 (therefore, the output is inverted in this example).

Next, the lead-bit data of odd data (the second read data) is also forwarded and arrive in the multiplexer MUX. Then, the system reference clock CLK rises, transfer gate T1 becomes conductive and T2 becomes non-conductive. Accordingly, the second read data supplied through the odd-line (the first odd data following the first even data) is output through the inverter 12.

Similarly, during the subsequent rise and fall phases of the system reference clock CLK, the even-line side and the odd-line side alternately become conductive, and even data and odd data successively supplied are output alternatingly. Accordingly, serial data containing 1-bit of each even data and odd data are alternately output from the i/o pad PA according to the rise and fall phases of the system reference clock CLK.

ii. Second Example of the Structure

Figure 8:
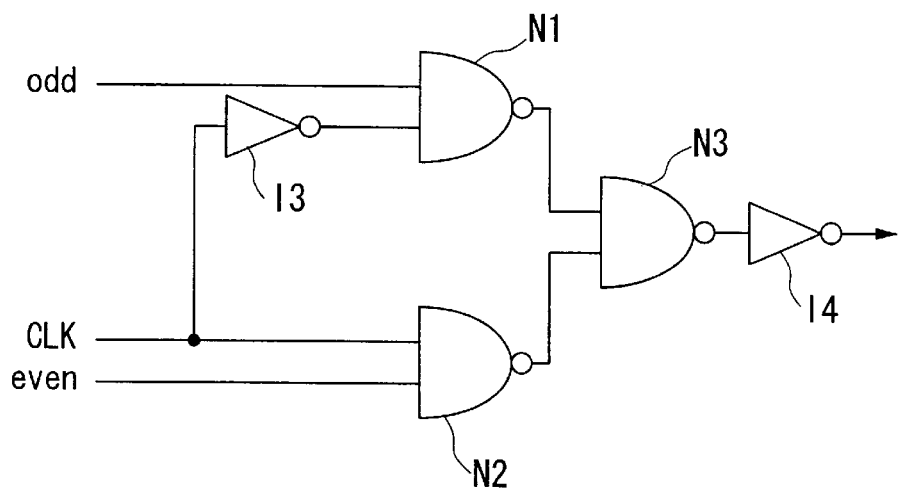
FIG. 8 is a schematic diagram of a second example of the configuration of the multiplexer MUX in the semiconductor memory device shown in FIG. 1.

An example of the second structure of the multiplexer MUX is shown in FIG. 8. In this diagram, signal lines indicated by "CLK", "even", and "odd" in the diagram refer to the clocking line, the even-line, and the odd-line, respectively, as in the first example. An inverter 13 inverts the system reference clock CLK within the multiplexer MUX, and its input-side is connected to the clocking line and its output-side is connected to the input-side of the NAND circuit N1. The other input-side of NAND circuit N1 is connected to the odd-line, and the output-side of NAND circuit N1 and the output-side of the NAND circuit N2 are connected to the input-sides of the NAND circuit N3. The input-sides of the NAND circuit N2 are connected to the clocking line and the even-line. The output-side of the NAND circuit N3 is connected to the input-side of the inverter 14, and the output-side of the inverter 14 is connected to the i/o pad PA (not shown), which inverts the data forwarded from the NAND circuit N3 and outputs inverted data.

In the structure described above, even data and odd data are supplied to the multiplexer MUX, and one or the other of these two groups of data is output according to the system reference clock CLK. Similar to the example given above, suppose that even data arrive first in the multiplexer MUX, and immediately afterwards, the system reference clock CLK rises so that the even data is inverted and output from the NAND circuit N2, and the NAND circuit N1 outputs H-level signals regardless of the state of odd data. Accordingly, the first even data supplied through the even-line is output through the NAND circuits N2, N3 and the inverter 14 (therefore, the output is also inverted in this example).

Next, odd data are also supplied and arrive in the multiplexer MUX. Then, the system reference clock CLK falls, the odd data inverted in the NAND circuit N1 is output from the NAND circuit N1, and the H-level signal is output from the NAND circuit N2 regardless of the state of even data. Accordingly, the odd data supplied through the odd-line, which follows the first even data, is output through the NAND circuits N1, N3 and the inverter 14.

Similarly, during the subsequent rise and fall phases of the system reference clock CLK, the even-line side and the odd-line side are alternately selected, and even data and odd data successively supplied are output alternatingly. Accordingly, serial data containing 1 bit of each even data and odd data are alternately output from the i/o pad PA according to the rise and fall phases of the system reference clock CLK.

As illustrated in the foregoing examples, data output means in the present memory device may be constructed using a gating circuit for inputting data from each storage section, and a gate control circuit for making the gates conductive or non-conductive according to rise and fall phases of a clock circuit, or using a logic gate circuit for receiving data from each storage section, outputting data according to rise and fall phases of a clock circuit, and a logic circuit for receiving the output data from the logic gate circuits and outputting data according to each input data.

(4) Clock Generation Circuit

Figure 9:
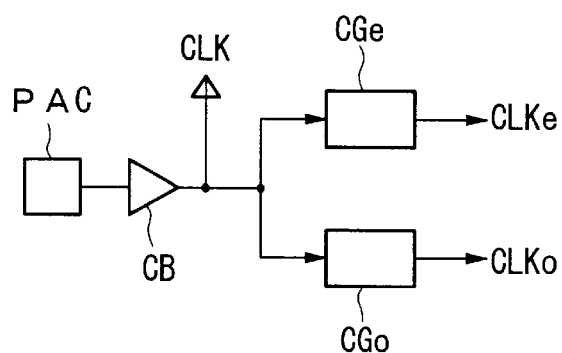
FIG. 9 is a schematic diagram of an example of the configuration of the clock generation circuit in the semiconductor memory device shown in FIG. 1.

A specific example of the clock generation circuit, which generates the internal clocks CLKe and CLKo, is shown in FIG. 9. Signals from the system reference clock CLK are input through a clock signal input pad PAc, which is disposed in the central region, and is connected to the signal line of an external system reference clock (corresponds to the system reference clock CLK shown as "CLK (external)"). A clock buffer CB is provided so as to connect its input-side to the clock signal input pad PAc and allocates clock signals of the system reference clock CLK to various regions of the memory device. The clock signals output from the clock buffer CB correspond to "CLK (internal)" in FIG. 6, and this clock is supplied to the demultiplexer DE-MUX and multiplexer MUX and other components of the memory device.

Internal clock generators CGe, CGo outputs signals of the internal clocks CLKe, CLKo based on the clock signals of the system reference clock CLK supplied from the clock buffer CB. These internal clock generators CGe, CGo operate independently to delay the system reference clock CLK appropriately, and adjust the duty cycles and other parameters as necessary to generate and output internal clocks CLKe, CLKo. Further, the internal clock generator CGe produces an internal clock CLKe having a steeply falling edge, and the internal clock generator CGo produces an internal clock CLKo having a steeply rising edge.

In the structure described above, the internal clock generators CGe, CGo receive common external clock signals through the clock signal input pad PAc and the clock buffer CB, and adjust the waveform of the signals independently so as to supply internal clock signals CLKe, CLKo such as those shown in FIG. 6 and supplies the signals to parallel-serial conversion circuits P-Se, P-So and other components of the memory device.

The present semiconductor memory device has been illustrated using the examples explained above, however, the present memory device need not be limited to those specific details provided to illustrate the invention. For example, in the foregoing examples, even data are generally output first, but the memory device can be applied when odd data are output first. In such a case, the odd data storage section is placed closer to the i/o pad PA, and the even data storage section should be placed further away from the i/o pad PA. Also, the number of bits of data that can be read in one access step may be any number and need not be limited to 8 bits. Further, components in the layout such as the serial-parallel conversion circuits, write-amps, data-amps and parallel-serial conversion circuits are placed in the region of column-decoder side in FIG. 2, but they may be placed in the region of the row-decoder side.

The operation of the present memory device is not limited to the system of illustrated clock signals. These examples illustrated are based on the so-called double data rate (DDR) method which is based on rise and fall phases of one system reference clock, because the memory device is effectively applied to DDR devices. In other words, the present memory device can be applied to any semiconductor device that processes even data and odd data according to predetermined clock timing. For example, the present memory device also can be applied to a semiconductor memory device that operates according to the so-called single data rate (SDR) method, in which even data are processed on the rise phases of specific timing signals (even numbered pulses, for example) generated by a reference clock, and odd data are processed on the rise phases of specific timing signals (odd numbered pulses, for example).

Therefore, it should be noted that the present semiconductor memory device is not limited by the specific details embodied in these examples, and is limited only by the claims that follow and may include those design modifications that fall within the principles illustrated in the present invention.

What is claimed is:

1. A semiconductor memory device for outputting data externally in response to the rise and fall of pulse signals of a reference clock, comprising:

a first storage section for storing only data for rise-phases of the reference clock and outputting the data successively for read operations;

a second storage section for storing only data for fall-phases of the reference clock and outputting the data successively for read operations; and data output means disposed in a vicinity of a terminal means for outputting data to an external environment for receiving data from said first storage section and said second storage section, and forwarding said data to said terminal means according to said rise and fall of the reference clock; wherein whichever storage section, said first storage section or said second storage section, that stores read data to be output first during a read operation is disposed closer to said data output means than the other storage section.

2. A semiconductor memory device for outputting data externally in response to the rise and fall of pulse signals of a reference clock, comprising:

a first storage section for storing only data for rise-phases of the reference clock and outputting the data successively For read operations;

a second storage section for storing only data for fall-phases of the reference clock and outputting the data successively for read operations; and data output means disposed in a vicinity of a terminal means for outputting data to an external environment for receiving data from said first storage section and said second storage section, and forwarding said data to said terminal means according to said rise and fall of the reference clock; wherein a path length connecting whichever storage section storing read data to be output first during a read operation to said data output means is made shorter than a path length connecting the other storage section to said data output means.

3. A semiconductor memory device according to claim 1, wherein said terminal means is located within a region between said first storage section and said second storage section and is disposed in a location closer to either said first storage section or said second storage section, whichever storage section stores said data to be output first being the section to which said terminal means is disposed closer.

4. A semiconductor memory device according to claim 2, wherein said terminal means is located within a region between said first storage section and said second storage section and is disposed in a location closer to either said first storage section or said second storage section, whichever storage section stores said data to be output first being the section to which said terminal means is disposed closer.

5. A semiconductor memory device according to claim 1, wherein said first storage section and said second storage section are provided with control clock signals that are adjusted individually to performance requirements of each storage section.

6. A semiconductor memory device according to claim 2, wherein said first storage section and said second storage section are provided with control clock signals that are adjusted individually to performance requirements of each storage section.

7. A semiconductor memory device according to claim 1, wherein said data output means comprises:
  a first gate and a second gate for receiving respective data output from said first storage section and said second storage section, and transmitting received data to said terminal means during their respective conductive phases; and
  gate controlling means for controlling conductive states of said first gate and said second gate so that said first gate is conductive and said second gate is non-conductive during the rise-phases while said first gate is non-conductive and said second gate is conductive during the fall-phases.

8. A semiconductor memory device according to claim 2, wherein said data output means comprises:
  a first gate and a second gate for receiving respective data output from said first storage section and said second storage section, and transmitting received data to said terminal means during their respective conductive phases; and
  gate controlling means for controlling conductive states of said first gate and said second gate so that said first gate is conductive and said second gate is non-conductive during the rise-phases while said first gate is non-conductive and said second gate is conductive during the fall-phases.

9. A semiconductor memory device according to claim 1, wherein said data output means comprises:
  a first logic gate for receiving data from said first storage section and outputting in response to input data during the rise-phases, and outputting a constant signal during the fall-phases;
  a second logic gate for receiving data from said second storage section and outputting in response to input data during the fall-phases, and outputting a constant signal during the rise phases; and
  a third logic gate for receiving output data from said first logic gate and said second logic gate so that when one logic gate is outputting a constant signal, data is output to said terminal means in response to the other logic gate that is outputting data.

10. A semiconductor memory device according to claim 2, wherein said data output means comprises:
  a first logic gate for receiving data from said first storage section and outputting in response to input data during the rise-phases, and outputting a constant signal during the fall-phases;
  a second logic gate for receiving data from said second storage section and outputting in response to input data during the fall-phases, outputting a constant signal during the rise-phases; and
  a third logic gate for receiving output data from said first logic gate and said second logic gate so that when one logic gate is outputting a constant signal, data is output to said terminal means in response to the other logic gate that is outputting data.

11. A semiconductor memory device for alternately outputting data stored in a first storage section and a second storage section to an external environment through terminal means, wherein said terminal means is disposed between said first storage section and said second storage section in such a way that data stored in said first storage section is output first, then data stored in said second storage section is output, and that said first storage section is disposed closer to said terminal means than said second storage section.

12. A semiconductor memory device according to claim 11, wherein said first storage section and said second storage section alternately store serial data transmitted from an external environment through said terminal means, and said memory device is further comprises:
  a first serial-parallel conversion means and a second serial-parallel conversion means for converting said serial data, that will be stored in respective first or second storage sections, into parallel data for storage; and
  a first parallel-serial conversion means and a second parallel-serial conversion means for converting said parallel data read out from said first and second storage sections into respective serial data for transmission; wherein
  path lengths connecting said terminal means to said first parallel-serial conversion means and said second parallel-serial conversion means are shorter than respective path lengths connecting said terminal means to said first serial-parallel conversion means and said second serial-parallel conversion means.

13. A semiconductor memory device according to claim 12, wherein said first parallel-serial conversion means and said second parallel-serial conversion means are both provided with a plurality of data-holding means for holding and outputting each bit-data of said parallel data; wherein
  a data-holding means for holding a lead-bit data of a contiguous read data is disposed closer to said terminal means than the other data-holding means for holding succeeding read data to follow said lead-bit data.

14. A semiconductor memory device for outputting data externally in response to rise and fall phases of pulse signals of a reference clock, comprising:
  a first storage section for storing first data coinciding with the rise phases of the reference clock and for outputting the first data successively for read operations;
  a second storage section for storing second data coinciding with the fall phases of the reference clock and for outputting the second data successively for read operations;
  a terminal means for outputting data to an external environment; and
  data output means disposed in a vicinity of the terminal means for receiving data from the first storage section and the second storage section, and for forwarding the data to the terminal means according to the rise and fall phases of the reference clock,
  wherein the first or second storage section that stores read data to be output first during a read operation is disposed closer to the data output means than the other storage section.

15. A semiconductor memory device for outputting data externally in response to rise and fall phases of pulse signals of a reference clock, comprising:

a first storage section for storing first data coinciding with the rise phases of the reference clock and for outputting the first data successively for read operations;

a second storage section for storing second data coinciding with the fall phases of the reference clock and for outputting the second data successively for read operations;

a terminal means for outputting data to an external environment; and data output means disposed in a vicinity of the terminal means for receiving data from the first storage section and the second storage section, and for forwarding the data to the terminal means according to the rise and fall phases of the reference clock, wherein a path length connecting the first or second storage section storing data to be output first during a read operation to the data output means is shorter than a path length connecting the other storage section to the data output means.

16. A semiconductor memory device comprising:

a first storage section;

a second storage section; and a terminal means for alternatively outputting data stored in the first and second storage seconds to an external environment in response to rise and fall phases of pulse signals of a reference clock, wherein the terminal means is disposed between the first storage section and the second storage section and disposed closer to the first storage section than the second storage section so that first data stored in the first storage section is output first, then second data stored in the second storage section is output.

17. A semiconductor memory device according to claim 16, wherein the first storage section and the second storage section alternately store serial data transmitted from the external environment through the terminal means, and further including:

a first serial-parallel conversion means and a second serial-parallel conversion means for converting the serial data to be stored in respective first or second storage sections, into parallel data for storage; and a first parallel-serial conversion means and a second parallel-serial conversion means for converting the parallel data read out from the first and second storage sections into respective serial data for transmission, wherein path lengths connecting the terminal means to the first parallel-serial conversion means and the second parallel-serial conversion means are shorter than respective path lengths connecting the terminal means to the first serial-parallel conversion means and the second serial-parallel conversion means.

18. A semiconductor memory device according to claim 17, wherein the first parallel-serial conversion means and the second parallel-serial conversion means are both provided with a plurality of data-holding means for holding and outputting each bit-data of the parallel data, and wherein the data-holding means that holds a lead-bit data of a contiguous read data is disposed closer to the terminal means than the other data-holding means that hold succeeding read data following the lead-bit data.

* * * * *